PATENT NUMBER: US 5,998,938
Date of Patent: Dec. 7, 1999
Inventors: Albert Comberg; Rebekka Porath, both of Aachen, Germany
Assignee: U.S. Philips Corporation, New York, N.Y.

CIRCUIT ARRANGEMENT WITH A PIEZOELECTRIC TRANSFORMER

Appl. No.: 09/141,642
Filed: Aug. 27, 1998

Foreign Application Priority Data

Aug. 28, 1997 [DE] Germany .............. 197 37 472

Int. Cl.$^6$ ............................. H01L 41/08
U.S. Cl. .................... 315/209 PZ; 315/266; 315/276; 310/358; 310/359
Field of Search ............. 315/209 R, 209 PZ, 315/266, 274, 276; 314/32; 361/207; 310/359, 357, 320, 311, 358

References Cited

U.S. PATENT DOCUMENTS

| | | | |
|---|---|---|---|
| 1,834,786 | 12/1931 | Kacser ............................ | 361/207 |
| 3,247,423 | 4/1966 | Nolta et al. ..................... | 315/209 PZ |
| 5,241,236 | 8/1993 | Sasaki et al. ................... | 310/358 |
| 5,576,590 | 11/1996 | Ohnishi et al. ................. | 310/359 |

OTHER PUBLICATIONS

M. Sugimoto et al, "Very Compact Inverter For Color LCD Backlight Utilizing a Packaged Piezoelectric Ceramic Transformer", SID 96, Digest, p. 757–760.

Primary Examiner—Dor Wong
Assistant Examiner—Wilson Lee
Attorney, Agent, or Firm—Daniel E. Tierney

[57] ABSTRACT

The invention relates to a circuit arrangement with a piezoelectric transformer having two electrodes arranged on the primary side of the transformer and such a piezoelectric transformer itself. Piezoelectric transformers of this type are used, for example, for the power supply or control of lamps or electron tubes. For controlling such a piezoelectric transformer directly on the primary side by a most frequently available DC voltage, instead of an AC voltage as is customary, according to the invention a DC voltage source is connected to the electrodes and a switching device is provided for interrupting the supply of voltage to at least one electrode, the positions of the switching device being dependent on the state of expansion of the primary side of the transformer. The switching device is thus periodically closed and opened, the applied DC voltage is thus interrupted periodically.

6 Claims, 2 Drawing Sheets

CIRCUIT ARRANGEMENT WITH A PIEZOELECTRIC TRANSFORMER

BACKGROUND OF THE INVENTION

The invention relates to a circuit arrangement with a piezoelectric transformer having two electrodes arranged on the primary side of the transformer and such a piezoelectric transformer itself.

Piezoelectric transformers are known electrical components which utilize the direct piezoelectric effect and simultaneously its reversal in a component. Electrical energy is first transformed into mechanical energy on the primary side and this mechanical energy is again transformed into electrical energy after internal transmission of mechanical energy from the primary to the secondary side. A piezoelectric transformer is predominantly used as a voltage transformer which transforms a low voltage (AC voltage) applied to the primary-side electrodes into a high voltage (AC voltage) which may be tapped from the output electrodes on the secondary side. A circuit arrangement including such a piezoelectric transformer for controlling an LCD is known, for example, from the publication by M. Sugimoto et al.; SID 96, Digest, p. 757 (1996).

Since a piezoelectric transformer is to be operated with an AC voltage on the primary side, control electronics are provided in known circuit arrangements which control electronics first transform an available DC voltage into an AC voltage which is then applied to the primary side of the piezoelectric transformer. These control electronics, however, require relatively much space compared with the small space required by the piezoelectric transformer, especially because of its lower height (compared with conventional inductive transformers).

SUMMARY OF THE INVENTION

Therefore, it is an object of the invention to provide a simplified circuit with a piezoelectric transformer as well as a piezoelectric transformer itself which avoids the above disadvantage.

This object is achieved according to the invention in that a DC voltage source is connected to the electrodes and in that a switching device is provided for interrupting the voltage supply of at least one electrode whose switching positions depend on the state of expansion of the primary side of the transformer.

The switching device is either closed or open in dependence on the state of expansion of the primary side of the transformer, so that the DC voltage applied is interrupted periodically. Separate control electronics for the switching device are not necessary.

A preferred embodiment provides that the switching device in the expanded state of the primary side is open and in non-expanded state of the primary side is closed. When the switching device is closed, a DC voltage is applied to the electrodes, after which the primary side is expanded as a result of the piezoelectric effect. It a certain degree of expansion is exceeded, the switching device provided according to the invention is opened, so that the supply of voltage is interrupted. Subsequently, the voltage potential applied to the electrodes diminishes again, so that also the primary side of the transformer contracts again. Below the specified degree of expansion, the switching device is closed again and the DC voltage is applied again after which the described operation starts from the beginning. The switching device is thus opened and closed as a result of the proper motion of the primary side of the transformer, and the DC voltage applied is thereby switched on and off, thus transformed into a pulsating DC voltage. With respect to the transmission of the mechanical energy inside the transformer and the AC voltage that can be tapped from the output, the described piezoelectric transformer behaves, in essence, as known piezoelectric transformers do. In the circuit arrangement according to the invention, however, the control electronics for generating an AC voltage for supplying power to the primary-side electrodes may be omitted.

The embodiment of the invention as claimed in claim 3 represents a solution option for the switching device which is easy to realize. This switching device may be arranged in that it is open in expanded state and closed in normal state. Between the "open" and "closed" switching states, there may be a smooth transition in that the conductivity steadily decreases with an increasing expansion of the switching device. There is no jerky switching on and off of the supplied DC voltage when the switching device expands or contracts, but the current flowing through the switching device steadily decreases or increases respectively.

The embodiment as claimed in claim 4 represents a simple and compact solution in which an electrode simultaneously forms the switching device. On the one hand, this saves cost during manufacture, more particularly due to the omission of method steps, and, on the other hand, reduces the required space. Such a layer whose conductivity diminishes with increasing expansion, is also referenced a percolation layer.

The invention also relates to a piezoelectric transformer as claimed in claim 5 which may be operated on the primary side by a DC voltage.

The circuit arrangement according to the invention is especially applied to the supply of power or control of lamps, more particularly, fluorescent or gas discharge lamps (for example, compact fluorescent lamps, cold-cathode fluorescent lamps, high-pressure gas discharge lamps), electron tubes or for grid control in X-ray tubes. In addition, the circuit arrangement according to the invention may be used in any situation where miniaturized voltage transformers having not too large an output power are needed.

These and other aspects of the invention will be apparent from and elucidated with reference to the embodiments described hereinafter.

DESCRIPTION OF THE PREFERRED EMBODIMENTS

Figure 1A:
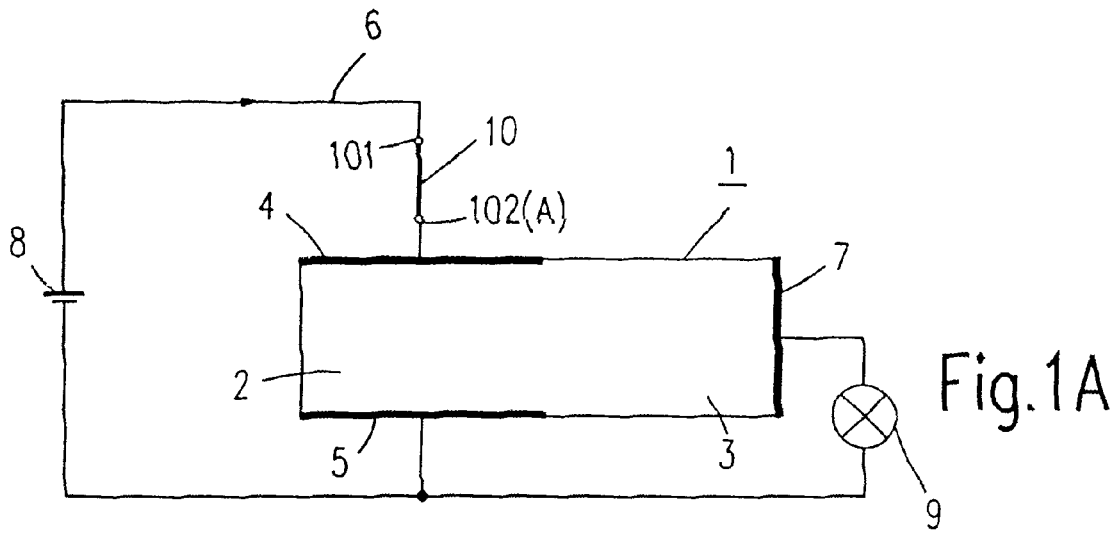
FIGS. 1A to 1C show a circuit arrangement according to the invention for controlling a lamp (in three states of expansion of the transformer)
Figure 1B:
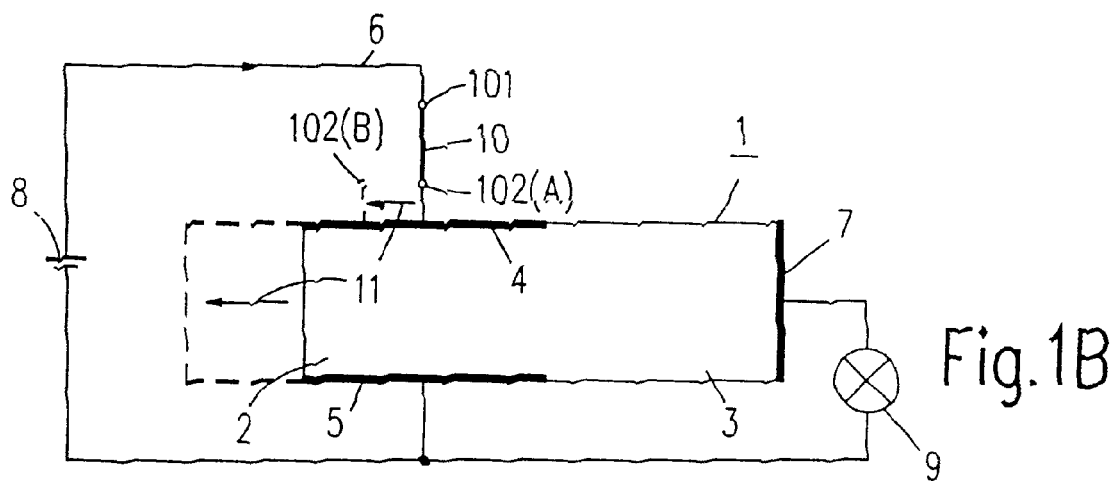
Figure 1C:
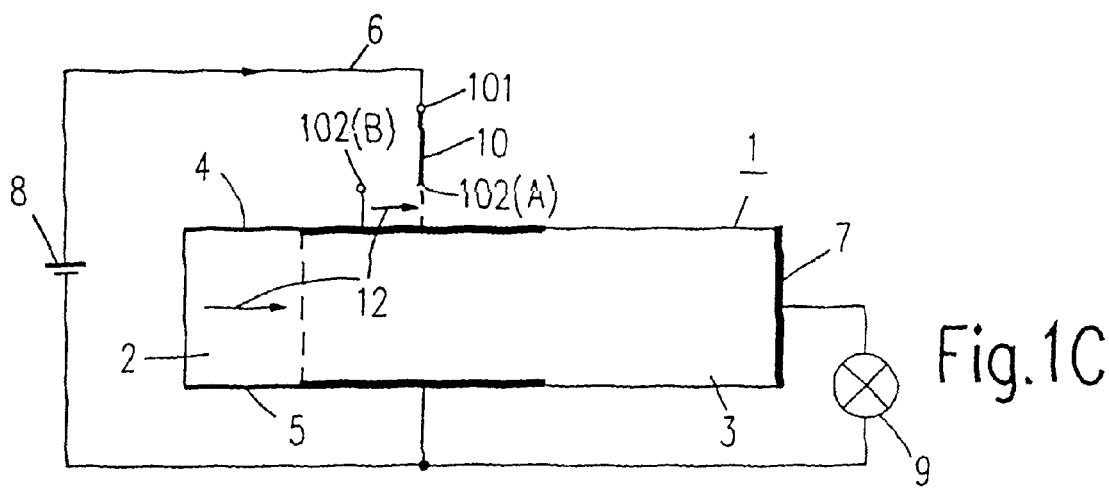

FIGS. 1A to 1C show a circuit arrangement according to the invention for supplying an AC voltage to a lamp 9, where the piezoelectric transformer 1 is shown in different states of expansion. The piezoelectric transformer 1 which is here arranged as a rectangular piezoceramic block and as a rose-type transformer, is subdivided into a primary side 2 and a secondary side 3. Two electrodes 4, 5 arranged on the surface form the primary electrodes which are connected to a DC voltage source, here a battery 8. From a secondary electrode 7 arranged on the secondary side 3 and the primary electrode 5 serving as a reference electrode may be tapped a high-frequency AC voltage for supplying power to the lamp 9. The direction of polarization of the piezoceramic on the primary side 2 and the secondary side 3 lies parallel with the primary electrodes 4 and 5 and parallel with the plane of projection.

In the power line 6 from the battery 8 to the primary electrode 4 is provided a switching device 10 having two switching contacts 101, 102. In FIG. 1A the primary side 2 is in a non-expanded state of rest in which also the switching device 10 is closed and the switching contact 102 is in the output phase (A). This state of rest is adopted by the primary side 2 when there is no or only a slight voltage potential between the primary electrodes 4, 5. When a DC voltage from the battery 8 is applied, a current will flow through the supply line 6 and the switch 10, so that between the electrodes 4, 5 there is a voltage potential. Based on the piezoelectric effect, this leads to an expansion of the primary side 2 in the direction denoted by the arrow 11. Since the switching contact 102 is fixedly connected to the electrode 4, which in its turn is fixedly secured to the surface of the primary side 2, also the switching contact 102 moves from position A to position B (see FIG. 1B). As a result, the switching device 10 is opened so that the supply of power from the battery 8 to the electrode is interrupted.

After the interruption of the power supply, the voltage potential applied between the electrodes 4, 5 again diminishes after which the primary side 2 contracts again and turns back to the state of rest into the direction of the arrow 12. This also causes the switching contact 102 to go back to the position referenced A and the switching device 10 is again closed (see FIG. 1C). Now current flows again through the switching device and again a voltage potential can build up between the electrodes 4, 5 so that the procedure described above again begins from the start.

In the described circuit arrangement, a high-frequency AC voltage can be tapped from the electrodes 7 and 5 as may be done in the known circuit arrangement. The internal transmission of mechanical energy from the primary side 2 to the secondary side 3 in the piezoelectric transformer shown takes place in the same manner as it does in known piezoelectric transforms, because the primary side 2 is caused to oscillate (with a resonance frequency), which primary side is coupled to the secondary side 3 and the secondary side 3 is also set to an oscillation mode. The magnitude of the output voltage that can be tapped depends on the power of the battery voltage and the selected transformation factor (which also depends on the internal structure of the piezoelectric transformer, for example, arrangement of the secondary side 3 with a plurality of piezoelectric layers separated by one electrode each).

In an embodiment in which not the electrode 5 is used as a common reference electrode for primary and secondary sides, but the secondary side 3 has its own second electrode as a reference electrode, the switching device may also be arranged in the power line from the battery 8 to the electrode 5 (by itself or in addition to the switching device 10 shown).

Figure 2A:
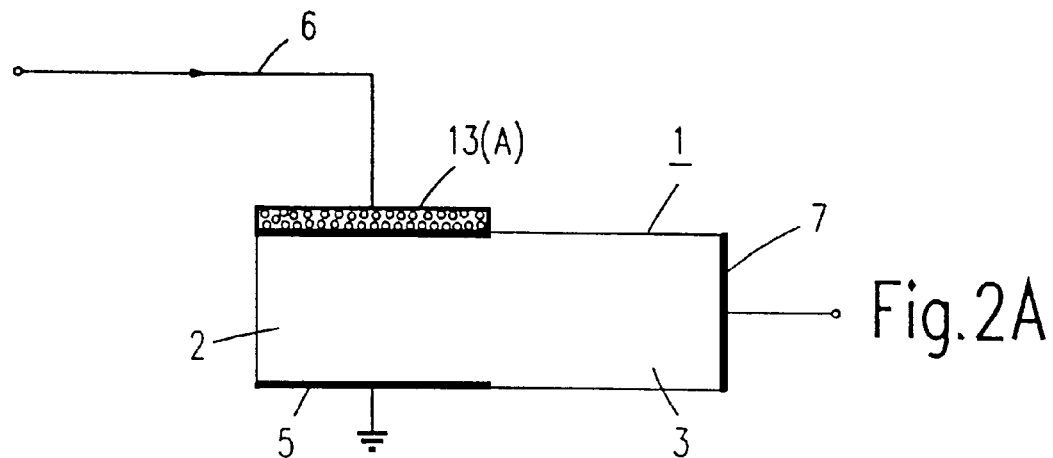
FIGS. 2A to 2C show a piezoelectric transformer according to the invention with a percolation layer (in three states of expansion).
Figure 2B:
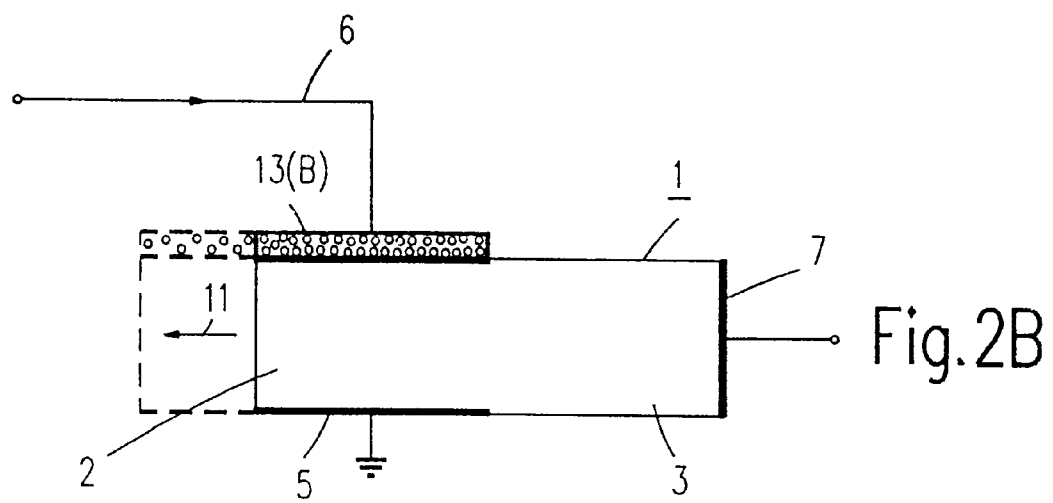
Figure 2C:
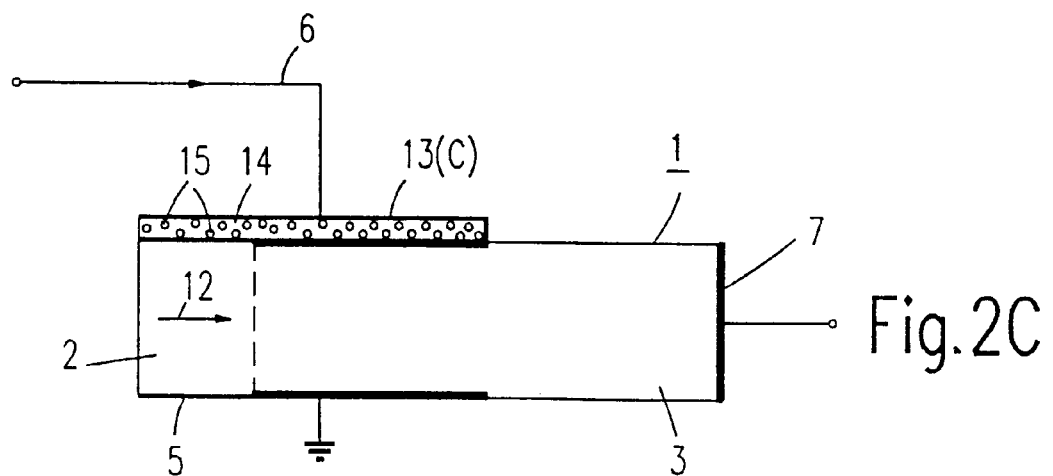

In FIGS. 2A to 2C is shown a further embodiment of the invention in which the piezoelectric transformer 1 is again represented in different states of expansion. The battery 8 shown in FIG. 1 and the lamp 9 are omitted here for clarity. The upper primary electrode (4 in FIG. 1) to which the DC supply line 6 is connected, is here arranged as a thin percolation layer 13. This also works as a switching device which is closed as a result of the expansion of the primary side 2 and can be opened, as will be explained hereinafter.

The percolation layer is arranged as a composite of elastic deformable material. This composite consists of an electrically insulating plastic matrix 14 (see FIG. 2C), for example, of a polymer, polyolefin or also $Si_2$ with deposited electrically conducting particles 15 which may also consist of, for example, metal, oxidically conductive material or graphite. Depending on the form and composition, the part of the conducting particles 15 in the percolation layer 13 preferably lies between 30% and 60%.

In FIG. 2A are shown the primary side 2 and the percolation layer 13 in unexpanded state of rest, in which the percolation layer 13 works as a closed switch. In this state, the conductive particles 15 touch each other or are so close together that a current that is substantially formed by tunnel currents can flow through the percolation layer 13. When a DC voltage is applied to the primary electrodes 13, 5, a voltage potential builds up between them which leads to an expansion of the primary side 2 and at the same time of the percolation layer 13 which is fixedly deposited on the primary side 2 in the direction of the arrow 11 (see FIG. 2B). As a result, the conducting particles 15 lose their contact and are moved apart so that no current can flow any longer through the percolation layer 13. The resistance of the percolation layer then steadily rises from the unexpanded state of rest (FIG. 2A) up to the maximum expanded state (FIG. 2C), so that the current flowing through the percolation layer 13 steadily decreases until no current at all can flow any longer. The voltage potential built up between the percolation layer 13 and the electrode 5 again diminishes, after which also the primary side 2 and the percolation layer 13 again return to the unexpanded state of rest and also the percolation layer 13 becomes conductive again. The operation described above again starts from the beginning.

The percolation layer so thin that the elastic properties of the piezoelectric transformer 1 are not affected by it. The frequency of the described periodic operation is now only intended for the electromechanical properties of the transformer itself, that is to say, one of its characteristic natural frequencies is set, more particularly, a resonance frequency.

It is also conceivable to arrange the switching device so that the known principle of the Wagner interrupter, in which an break contact is alternately opened (by the magnetic field of an electromagnet when a current flows through the electromagnet and the break contact) and closed (for example, by a spring when no current flows).

We claim:

1. A circuit arrangement with a piezoelectric transformer having two electrodes arranged on the primary side of the transformer, characterized in that a DC voltage source is connected to the electrodes and in that a switching device is provided for interrupting the voltage supply of at least one electrode whose switching positions depend on the state of expansion of the primary side of the transformer.

2. A circuit arrangement as claimed in claim 1, characterized in that the switching device is arranged so that it is open in the expanded state of the primary side and closed in the non-expanded state of the primary side.

3. A circuit arrangement as claimed in claim 1, characterized in that the switching device can be expanded and is directly connected to an electrode or to the primary side, in that the state of expansion the switching device depends on the state of expansion of the primary side of the transformer, and in that the switching device is arranged so that its conductivity depends on its state of expansion so that the conductivity decreases with increasing expansion.

4. A circuit arrangement as claimed in claim 1, characterized in that the switching device is formed by a layered electrode which comprises of an electrically insulating material capable of expanding, having deposited electrically conductive particles.

5. A piezoelectric transformer having two electrodes arranged on the primary side of the transformer, characterized in that at least one electrode has a switching device or is itself arranged as a switching device having switching states which depend on the state of expansion of the primary side of the transformer.

6. A use of the circuit arrangement as claimed in claim 1, for the power supply or control of lamps, more particularly, fluorescent or gas-discharge lamps, electron tubes or X-ray tubes.

* * * * *